United States Patent
Togashi et al.

(10) Patent No.: US 6,807,047 B2
(45) Date of Patent: Oct. 19, 2004

(54) ELECTRONIC DEVICE AND INTERPOSER BOARD

(75) Inventors: Masaaki Togashi, Tokyo (JP); Taisuke Ahiko, Akita-ken (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/674,471

(22) Filed: Oct. 1, 2003

(65) Prior Publication Data

US 2004/0066589 A1 Apr. 8, 2004

(30) Foreign Application Priority Data

Oct. 8, 2002 (JP) ........................................ 2002-294542

(51) Int. Cl.[7] ................................................ H01G 4/06
(52) U.S. Cl. ................................ 361/321.2; 361/306.3; 361/303
(58) Field of Search ........................... 361/321.2, 321.3, 361/306.3, 303, 306.1, 309, 310

(56) References Cited

FOREIGN PATENT DOCUMENTS

| JP | A 8-55752 | 2/1996 |
|---|---|---|
| JP | A 9-246083 | 9/1997 |
| JP | A 2000-182887 | 6/2000 |
| JP | A 2000-223357 | 8/2000 |
| JP | A 2000-232030 | 8/2000 |
| JP | A 2000-235931 | 8/2000 |

*Primary Examiner*—Anthony Dinkins
(74) *Attorney, Agent, or Firm*—Oliff & Berridge, PLC

(57) ABSTRACT

A multilayer capacitor (2) consisting of a capacitor body (1) and an interposer board (20) arranged underneath it, wherein a pair of land patterns are arranged on a front surface of the interposer board (20) for connection with a pair of terminal electrodes of the capacitor body (11) and (12), and a pair of external electrodes are arranged on a back surface of the interposer board (20) for connection with interconnect patterns (34) of a mounting board (33) by solder (35), the pair of land patterns and the pair of external electrodes being arranged on the interposer board (20) so that a direction of a line connecting the pair of land patterns and a direction of a line connecting the pair of external electrodes intersect perpendicularly.

14 Claims, 20 Drawing Sheets

ELECTRONIC DEVICE AND INTERPOSER BOARD

BACKGROUND OF THE INVENTION

1. Field of the Invention

The present invention relates to an electronic device and interposer board suppressing the propagation of vibration caused by a piezoelectric property and electrostriction and thereby reducing noise, more particularly relates to an electronic device and interposer board suitable for an electronic device including a multilayer ceramic capacitor able to be used for an audio circuit or other circuit sensitive to noise.

2. Description of the Related Art

There have been dazzling advances made in thin film technology and multilayer technology for multilayer ceramic capacitors in recent years. Capacitors having high electrostatic capacities comparable with those of aluminum electrolytic capacitors are being commercialized. As the ceramic materials for forming the multilayer bodies of such multilayer ceramic capacitors, barium titanate and other ferroelectric materials with relatively high dielectric constants are generally being used. These ferroelectric materials, however, have piezoelectric properties and electrostriction properties, so when these ferroelectric materials are subjected to electric fields, stress and mechanical strain occur.

Further, when a multilayer ceramic capacitor using such a ferroelectric material is subjected to an AC voltage, stress and mechanical strain occurring in synchronization with the frequency of the AC voltage appear as vibration. As a result, this vibration is transmitted from the terminal electrodes of the multilayer ceramic capacitor to the board side.

An example of a multilayer ceramic capacitor is shown in FIG. 18. In this multilayer ceramic capacitor 110, two types of internal electrodes are alternately arranged in the multilayer body 112. Terminal electrodes 114, 116 connected to these internal electrodes are arranged at the ends of the multilayer body 112. This capacitor 110 is, for example as shown in FIG. 19 and FIG. 20, mounted on a board 120 so as to connect the terminal electrodes 114, 116 to the interconnect patterns 122 by solder 118.

When such a multilayer ceramic capacitor 110 is subjected to AC voltage, stress P etc. occurs at the multilayer body 112 forming the main part of the multilayer ceramic capacitor 110 and vibration occurs along with this. This vibration is transmitted from the terminal electrodes 114, 116 to the board 120. The board 120 as a whole is liable to become a sound radiating surface and generate vibration sound becoming the noise N.

Such vibration sound has a detrimental effect on the performance and quality of equipment having audio circuits or other circuits sensitive to noise. Therefore, use of multilayer ceramic capacitors using ferroelectric materials for such equipment has generally been avoided.

Note that the technologies disclosed in Japanese Unexamined Patent Publication (Kokai) No. 2000-235931, Japanese Unexamined Patent Publication (Kokai) No. 9-246083, Japanese Unexamined Patent Publication (Kokai) No. 6-55752, Japanese unexamined Patent Publication (Kokai) No. 2000-232030, Japanese Unexamined Patent Publication (Kokai) No. 2000-223357, and Japanese Unexamined Patent Publication (Kokai) No. 2000-182887 are known. However, the inventions disclosed in these publications are insufficient in respect to the suppression of the propagation of vibration caused due to the piezoelectric property and electrostriction and the reduction of noise.

SUMMARY OF THE INVENTION

An object of the present invention is to provide an electronic device able to suppress the propagation of vibration occurring due to a piezoelectric property and electrostriction and thereby reduce the occurrence of noise and an interposer board used for such an electronic device.

To achieve the above object, according to a first aspect of the present invention, there is provided an electronic device having a body having a pair of terminal electrodes and an interposer board to a front surface of which the pair of terminal electrodes are connected and having on its back surface a pair of external electrodes electrically connected to the parts where the pair of terminal electrodes are connected, wherein the terminal electrodes and the external electrodes are arranged in a positional relationship where the direction of a line connecting the pair of terminal electrodes and the direction of a line connecting the pair of external electrodes intersect.

Preferably, a pair of land patterns to which the pair of terminal electrodes are to be connected are provided on the front surface of the interposer board, and these land patterns and external electrodes are arranged in a positional relationship where the direction of a line connecting the pair of land patterns and the direction of the line connecting the pair of external electrodes intersect.

According to a second aspect of the present invention, there is provided an interposer board to a front surface of which a pair of terminal electrodes are to be connected and having on its back surface a pair of external electrodes electrically connected to parts where the pair of terminal electrodes are connected, wherein a pair of land patterns to which the pair of terminal electrodes are to be connected are provided on a front surface of said interposer board, and these land patterns and external electrodes are arranged in a positional relationship where the direction of a line connecting the pair of land patterns and the direction of the line connecting the pair of external electrodes intersect.

In the interposer board and electronic device according to the present invention, the back surface of the interposer board is provided with a pair of external electrodes connected to the parts where the pair of terminal electrodes are connected, and these are arranged in a positional relationship where the direction of a line connecting the pair of land patterns and the direction of the line connecting the pair of external electrodes intersect. Further, the electronic device is mounted on an external board by the pair of external electrodes being connected to the interconnect patterns of the external board.

Along with application of an AC voltage to an electronic device, vibration occurs due to the piezoelectric property and electrostriction of the body. In the present invention, however, since the direction of the line connecting the pair of terminal electrodes of the body and the direction of the line connecting the pair of external electrodes of the interposer board intersect, the propagation of the vibration to the external board becoming the sound radiating surface is suppressed and generation of noise from the substrate is reduced.

That is, in the present invention, by just adding the interposer board to the body and connecting the body to the external board through the interposer board, vibration transmitted from the pair of external terminals of the interposer board to the external board can be reduced and the generation of noise from the external board can be reduced. This is because the direction of vibration of the body mainly matches with the direction of the line connecting the terminal electrodes and the direction of vibration does not match with the direction of the line connecting the pair of external terminals of the interposer board.

Preferably, the pair of terminal electrodes in the body and the interposer board are connected by high temperature solder or a conductive adhesive. By the pair of terminal electrodes and the interposer board being connected by the high temperature solder or conductive adhesive, these are mechanically connected while securing conductivity.

Preferably, the front and back surfaces of the interposer board are provided with conductor patterns, solder resist is coated on the surfaces of the conductor patterns to expose at least part of the surfaces of the conductor patterns, and as a result the pair of land patterns are formed on the front surface of the interposer board and the pair of external electrodes are formed on the back surface of the interposer board. Preferably, connecting electrodes connecting the conductor patterns present on the front and back surfaces of the interposer board are provided on the interposer board. By this configuration, the pair of land patterns and the pair of external electrodes are reliably electrically connected.

Preferably, the connecting electrodes are through hole electrodes passing through the interposer board. The rigidity of the interposer board drops due to the presence of through hole electrodes, so this interposer board can further reduce vibration.

Preferably, the ends of the interposer board are recessed and the connecting electrodes are arranged in the recessed parts. By arranging the connecting electrodes in the recessed parts of the interposer board, the connecting electrodes can also serve as external electrodes. Along with this, there is no longer a need for using through hole electrodes.

Preferably, the electronic device of the present invention has a plurality of such bodies and the plurality of such bodies are arranged on such an interposer board. The plurality of bodies may also be arranged stacked. By arranging a plurality of bodies, an electronic device having a higher electrostatic capacity can be easily obtained and replacement of aluminum electrolytic capacitors becomes even easier.

The body is not particularly limited, but for example multi layer ceramic capacitor, chip-type tantalum electrolytic capacitor, chip-type film capacitor, chip-type aluminum electrolytic capacitor, etc. may be mentioned. Preferably, it is a multilayer ceramic capacitor.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

First Embodiment

A multilayer capacitor 1 of an electronic device according to a first embodiment of the present invention will be shown first in FIG. 1 to FIG. 7. This capacitor 1 has a capacitor body 2 comprised mainly of a dielectric body 3 comprised of a rectangular parallelopiped shaped sintered body obtained by firing a multilayer body obtained by stacking a plurality of ceramic green sheets.

Figure 2:
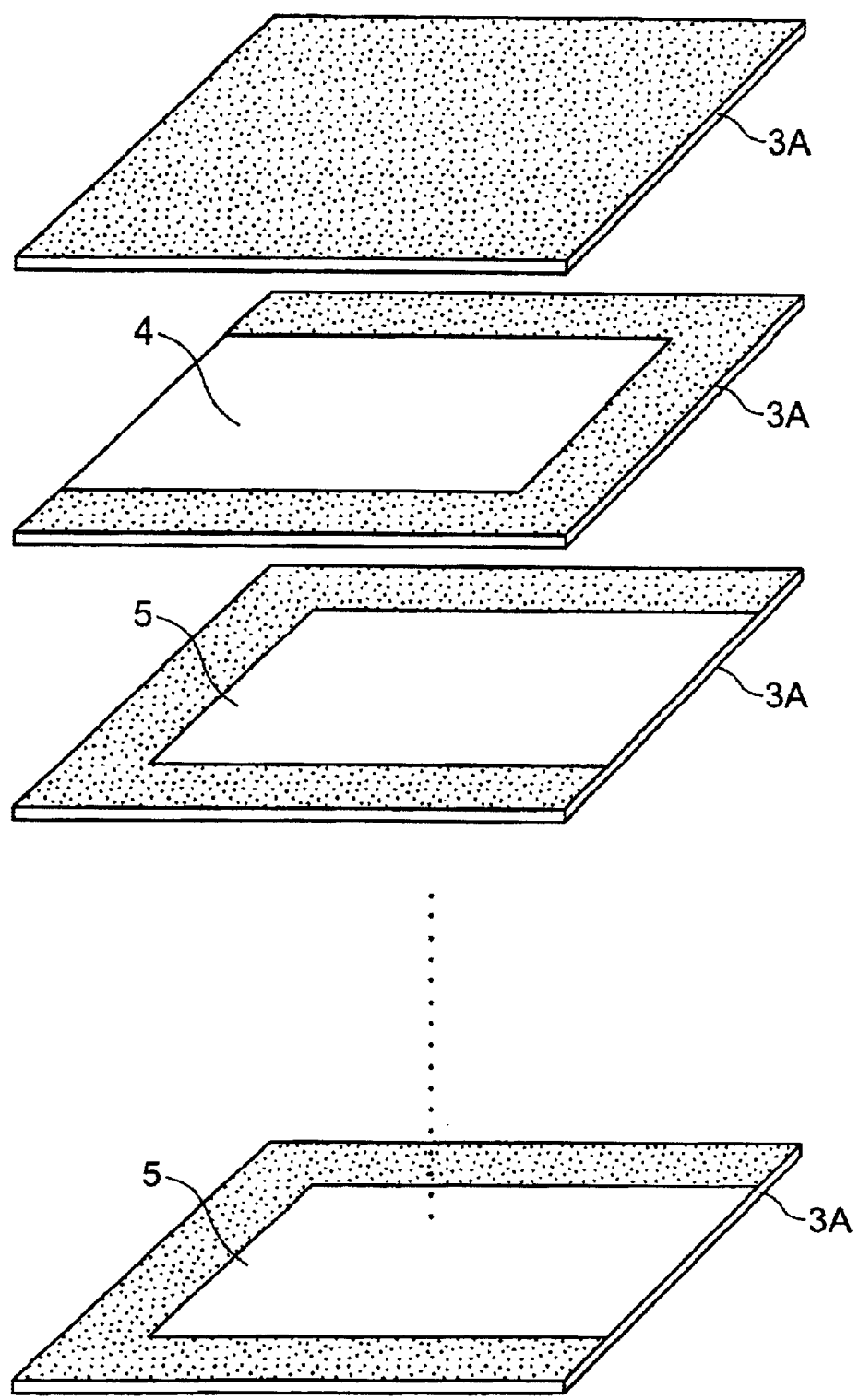
FIG. 2 is a disassembled perspective view of a capacitor body used in the first embodiment of the present invention.
Figure 3:
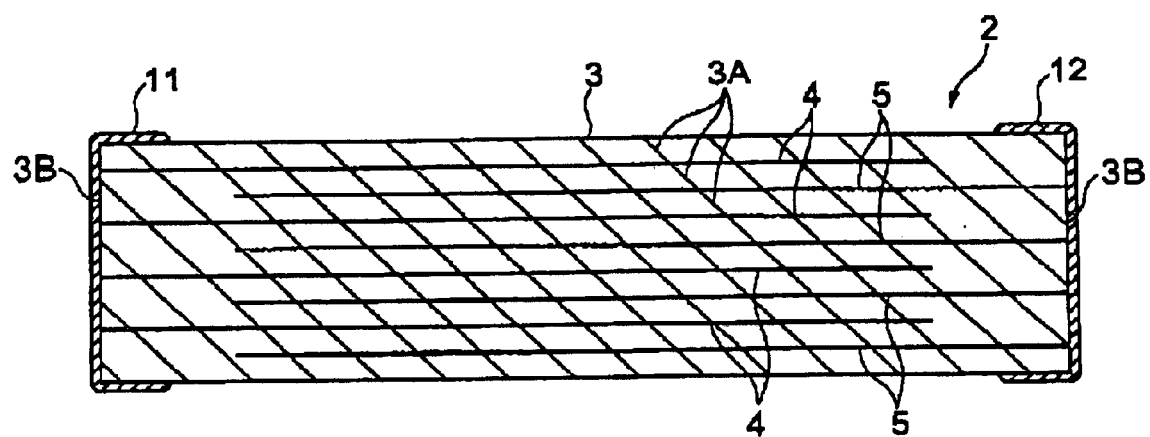
FIG. 3 is a sectional view of a capacitor body used in the first embodiment of the present invention.

The dielectric body 3 is formed of a stack of dielectric layers comprised of fired ceramic green sheets. As shown in FIG. 2 and FIG. 3, a planar shaped internal conductor 4 is arranged at a predetermined height position in the stacking direction in the dielectric body 3. In the dielectric body 3, a similarly planar shaped internal conductors 5 is arranged below the internal conductor 4 separated by a ceramic layer 3A constituting a dielectric layer. In the same way after this, a plurality of similarly formed internal conductors 4 and internal conductors 5 are repeatedly arranged (for example, about 100 layers) separated by the ceramic layers 3A.

As shown in FIG. 3, the two types of internal conductors, that is, the internal conductors 4 and internal conductors 5, are arranged facing each other separated by the ceramic layers 3A in the dielectric body 3. Further, the centers of these internal conductors 4 and internal conductors 5 are arranged at substantially the same positions as the centers of the ceramic layers 3A. The vertical and horizontal dimensions of the internal conductors 4 and the internal conductors 5 are made smaller than the lengths of the corresponding sides of the ceramic layers 3A.

However, as shown in FIG. 2, the conductor of the internal conductor 4 is projected out from the left side toward the end of the left side of the ceramic layer 3A by the same width dimension as the width dimension of the internal conductor 4. Further, the conductor of the internal conductor 5 is projected out from the right side toward the end of the right side of the ceramic layer 3A by the same width dimension as the width dimension of the internal conductor 5.

As the materials of the internal conductors 4, 5 formed in approximately rectangular shapes, not only may the base metal nickel, nickel alloys, copper, or copper alloys be considered, but also materials mainly comprised of these metals may be considered.

As shown in FIG. 3, the terminal electrode 11 connected to the projecting parts of the left sides of the internal conductors 4 is arranged at the left side face 3B of the outside of the dielectric body 3. Further, the terminal electrode 12 connected to the projecting parts of the right sides of the internal conductors 5 is arranged at the right side face 3B of the outside of the dielectric body 3.

In this embodiment, the pair of terminal electrodes 11, 12 are arranged at the two side faces 3B among the four side faces 3B, 3C of the rectangular parallelopiped shaped dielectric body 3 in the capacitor body 2.

Figure 1:
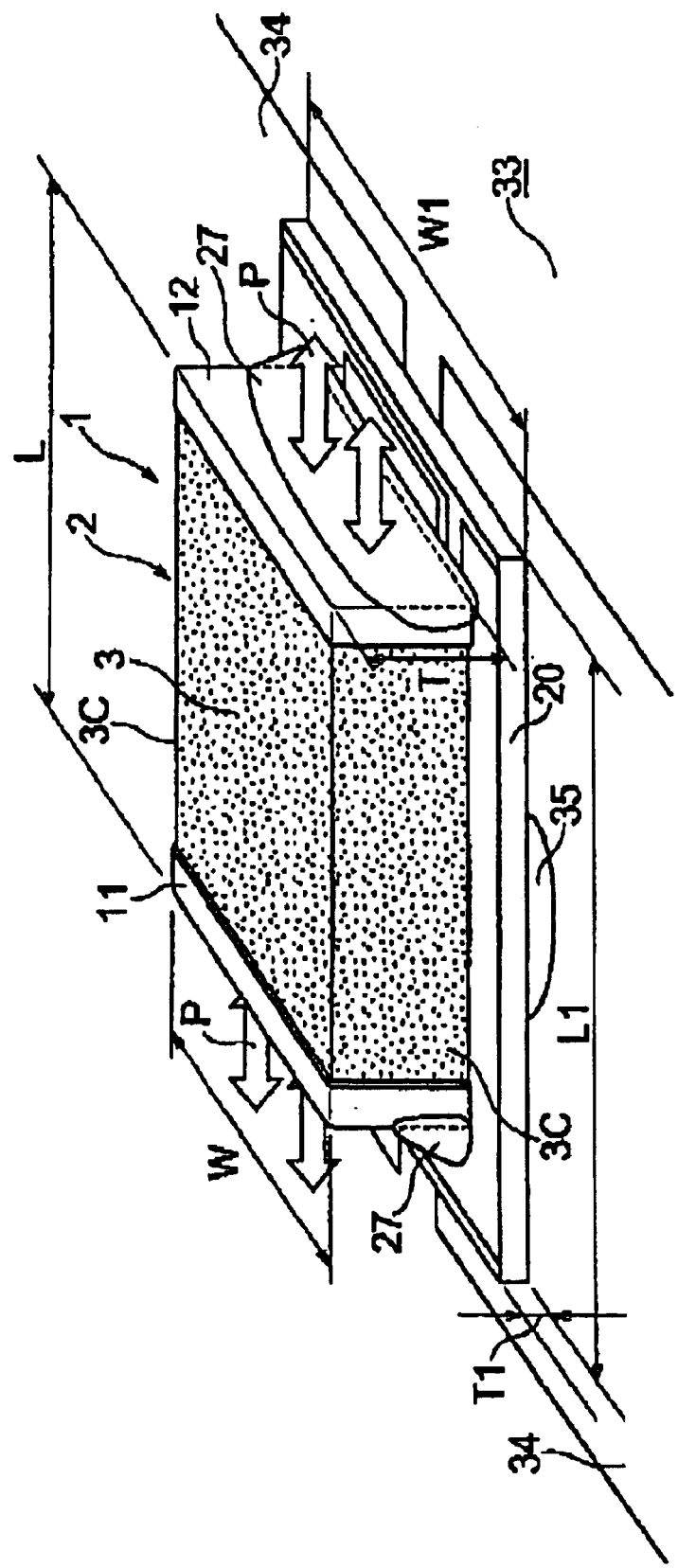
FIG. 1 is a perspective view of the state of a multilayer capacitor according to a first embodiment of the present invention mounted on a board.
Figure 4A:
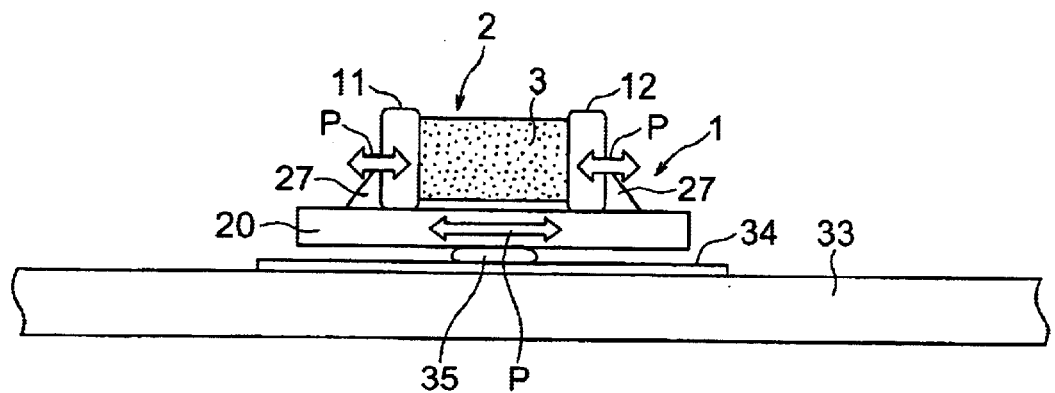
FIG. 4A is a front view of the state of a multilayer capacitor according to a first embodiment of the present invention mounted on a board.
Figure 4B:
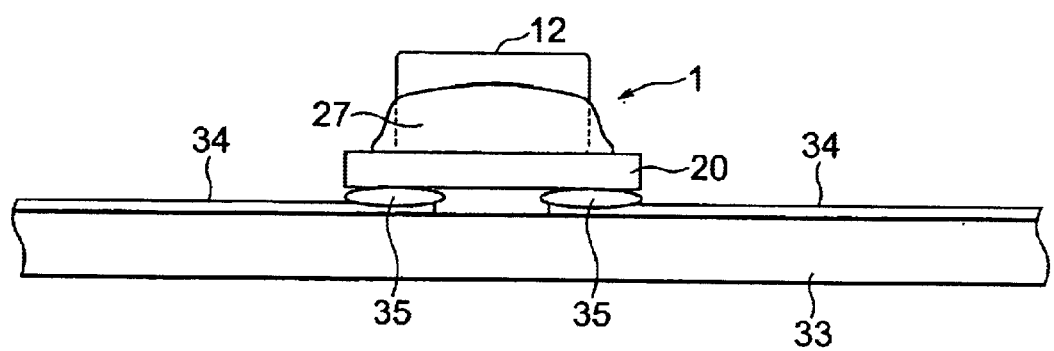
FIG. 4B is a side view of FIG. 4A.
Figure 5:
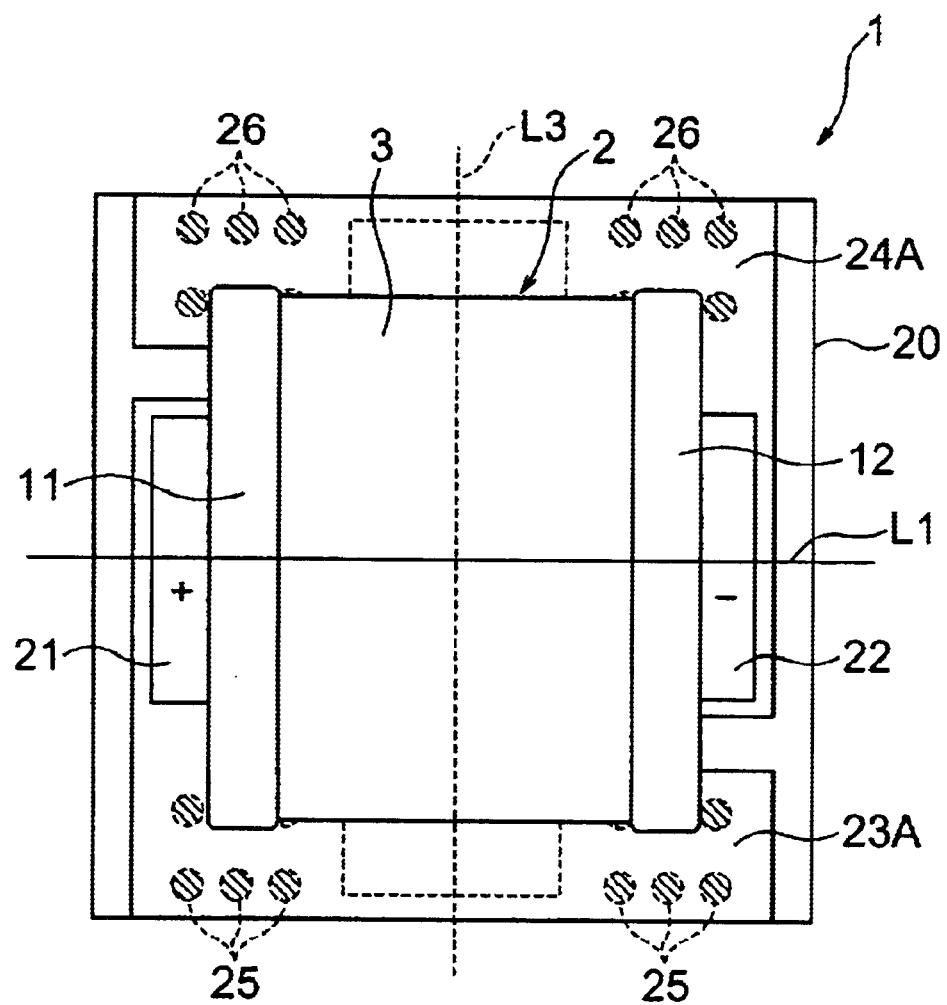
FIG. 5 is a plan view of a multilayer capacitor according to a first embodiment of the present invention (with high temperature solder omitted)
Figure 7A:
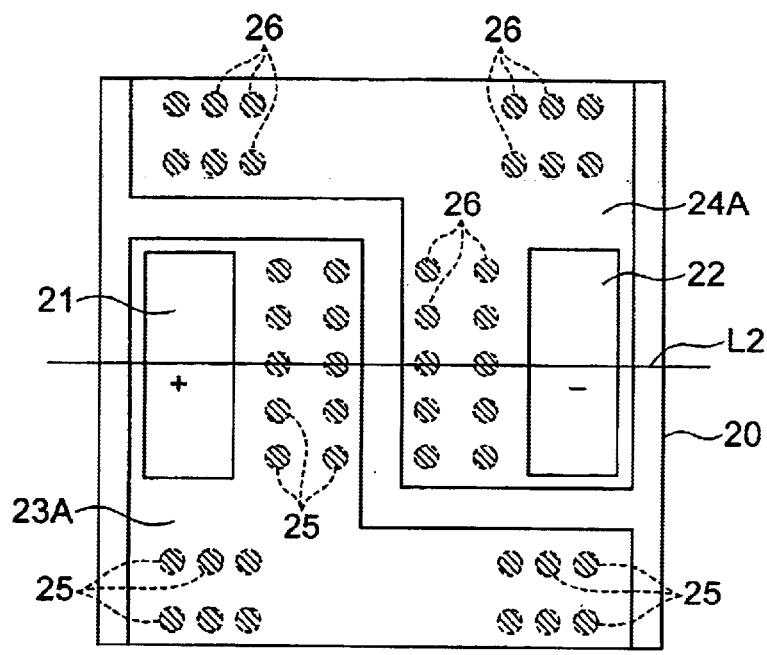
FIG. 7A is a plan view of an interposer board used for a multilayer capacitor according to a first embodiment of the present invention (front surface)
Figure 7B:
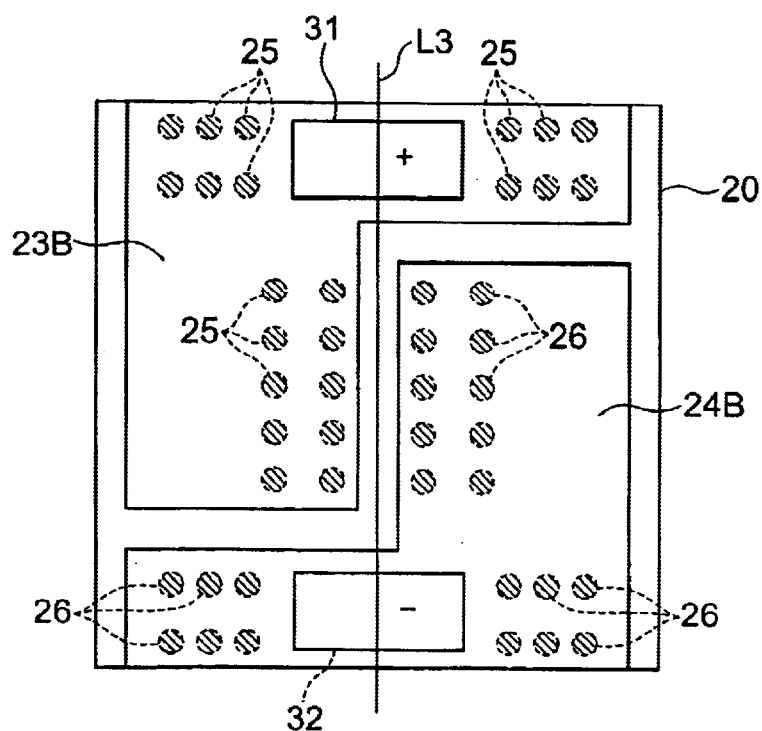
FIG. 7B is a bottom view of the back surface of FIG. 7A.

As shown in FIG. 1, FIG. 4, and FIG. 5, a single interposer board 20 mainly comprised of a glass epoxy-based resin is arranged under the capacitor body 2 forming the main part of the multilayer capacitor 1 according to the present embodiment. The front and back surfaces of the interposer board 20 are, as shown in FIG. 7A and FIG. 7B, provided with L-shaped copper foil conductor patterns 23A, 23B, 24A, 24B arranged in pairs for a total of four patterns. The necessary locations on the front and back surfaces of the board 20 are coated with a solder resist.

Figure 6:
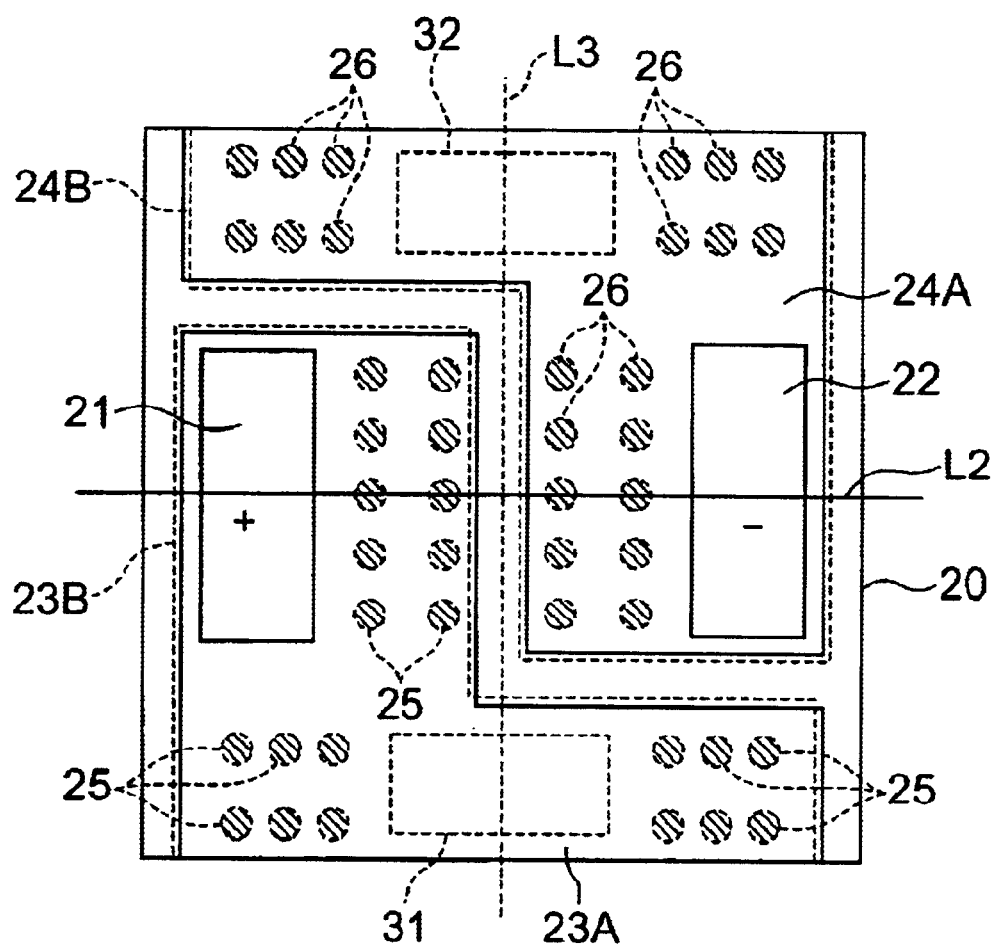
FIG. 6 is a plan view of an interposer board used for the multilayer capacitor according to a first embodiment of the present invention.

Along with this, as shown in FIG. 6 and FIG. 7A, the front surface of the interposer board 20 is provided with a pair of land patterns 21, 22 to be connected with the pair of terminal electrodes 11, 12 of the capacitor body 2. Further, as shown in FIG. 1, FIG. 4A, FIG. 4B, and FIG. 7B, the back surface of the interposer board 20 is provided with a pair of external terminals 31, 32 able to be connected by solder 35 to the interconnect patterns 34 of the board 33.

The parts corresponding to the pair of land patterns 21, 22 and the pair of external electrodes 31, 32 in the conductor patterns 23A, 23B, 24A, 24B are not coated with solder resist. Note that as the material of the solder resist, glass epoxy resin, etc. may be mentioned.

The pair of terminal electrodes 11, 12 in the capacitor body 2 and the pair of land patterns 21, 22 of the interposer board 20 are connected by high temperature solder 27. Note that instead of using this high temperature solder 27, it is also possible to use a conductive adhesive to connect the pair of terminal electrodes 11, 12 and the pair of land patterns 21, 22.

That is, the terminal electrode 11 positioned at the left side of the multilayer capacitor 1 in FIG. 1, FIG. 4A, and FIG. 5 is connected by high temperature solder 27 to the land pattern 21, while the terminal electrode 12 positioned at the right side of the multilayer capacitor 1 in FIG. 1, FIG. 4A, and FIG. 5 is connected by high temperature solder 27 to the land pattern 22.

Further, as shown in FIG. 6 and FIGS. 7A, 7B, to connect th conductor pattern 23A and conductor pattern 23B present at the front and back surfaces of the interposer board 20, a plurality of through hole electrodes 25 serving as connecting electrodes formed in columnar shapes are provided in a manner passing through the interposer board 20. Due to this, the land pattern 21 on the front surface of the interposer board 20 and the external electrode 31 on the back surface are electrically connected by these through hole electrodes 25. Therefore, the external electrode 31 is connected to the terminal electrode 11 through the land pattern 21.

Similarly, to connect the conductor patterns 24A, 24B present at the front and back surfaces of the interposer board 20, a plurality of through hole electrodes 26 serving as connecting electrodes formed in columnar shapes are provided in a manner passing through the interposer board 20. Due to this, the land pattern 22 on the front surface of the interposer board 20 and the external electrode 32 on the back surface are electrically connected by these through hole electrodes 26. Therefore, the external electrode 32 is connected to the terminal electrode 12 through the land pattern 22.

As shown in FIG. 5 to FIG. 7B, when for example the external electrode 31 becomes plus and the external electrode 32 becomes minus, the land pattern 21 and the terminal electrode 11 become plus through the through hole electrodes 25. Further, the land pattern 22 and the terminal electrode 12 become minus through the through hole electrodes 26. Further, when for example the external electrode 31 becomes minus and the external electrode 32 becomes plus, the polarities become the reverse to the above.

In the present embodiment, as shown in FIG. 6, the pair of land patterns 21, 22 and the pair of external electrodes 31, 32 are arranged on the interposer board 20 so that the direction along the line L2 connecting the pair of land patterns 21, 22 and the direction along the line L3 connecting the pair of external electrodes 31, 32 intersect perpendicularly.

Further, as shown in FIG. 5, the pair of terminal electrodes 11, 12 are arranged at substantially the same positions as the pair of land patterns 21, 22 so as to be connected to the pair of land patterns 21, 22. Therefore, the direction along the line L1 connecting the pair of terminal electrodes 11, 12 and the direction along the line L3 connecting the pair of external electrodes 31, 32 can be said to intersect perpendicularly as well. Note that the lines L1, L2, and L3 are lines passing through the centers of the patterns or electrodes.

Next, the action of the multilayer capacitor 1 according to the present embodiment will be explained. The multilayer capacitor 1 according to the present embodiment has a capacitor body 2 having a pair of terminal electrodes 11, 12. The pair of terminal electrodes 11, 12 are connected to a pair of land patterns 21, 22 formed on the front surface of an interposer board. The back surface of the interposer board 20 is provided with a pair of external electrodes 31, 32. The pair of external electrodes 31, 32 are electrically connected to the pair of land patterns 21, 22 through the conductor patterns 23A, 23B, 24A, 24B and the through hole electrodes 25, 26.

In the present embodiment, the direction of the line L2 connecting the pair of land patterns 21, 22 at the front surface of the interposer board 20 and the direction of the line L3 connecting the pair of external electrodes 31, 32 at the back surface of the interposer board 20 intersect perpendicularly. Along with this, the direction of the line L1 connecting the pair of terminal electrodes 11, 12 and the direction of the line L3 connecting the pair of external electrodes 31, 32 intersect perpendicularly.

As shown in FIG. 6, FIG. 7A, and FIG. 7B, the pair of external electrodes 31, 32 are connected by solder 35 to the interconnect patterns 34 of the board 33 shown in FIG. 1 and FIG. 4. In this way, as shown in FIG. 1 and FIG. 4, the multilayer capacitor 1 is mounted on the external board 33.

If an AC voltage is applied to the multilayer capacitor 1, stress P occurs in the direction shown by the arrow in FIG. 1 and FIG. 4A due to the piezoelectric property and electrostriction of the capacitor body 2. Along with this, vibration occurs. The direction of the vibration due to this stress P matches with the direction of the lines L1 and L2. In the present embodiment, the direction of the line L1 connecting the pair of terminal electrodes 11, 12 of the capacitor body 2 and the direction of the line L3 connecting the pair of external electrodes 31, 32 in the interposer board 20 intersect perpendicularly. As a result, propagation of vibration in the direction of the lines L1 and L2 at the board 33 becoming the sound radiating surface is suppressed and the occurrence of noise from the board 33 is reduced.

In the present embodiment, the interposer board 20 is added to the capacitor body 2 and the capacitor body 2 is connected to the board 33 through the interposer board 20. Further, the direction in which the pair of terminal electrodes 11, 12 are arranged and the direction in which the pair of external electrodes 31, 32 are arranged are made to intersect at right angles. Therefore, while vibration accompanying the stress P is transmitted from the pair of terminal electrodes 11, 12 of the capacitor body 2 to the interposer board 20, the vibration in the direction of greatest amplitude is absorbed by the interposer board 20. Therefore, it is possible to reduce the vibration transmitted from the pair of external terminals 31, 32 in the interposer board 20 to the board 33 and generation of noise from the board 33 is reduced.

In the multilayer capacitor 1 according to the present embodiment, since the pair of terminal electrodes 11, 12 in the capacitor body 2 and the interposer board 20 are connected by high temperature solder 27 or conductive adhesive, these are connected mechanically while securing conductivity. Note that in the present invention, as the high temperature solder 27, for example, a eutectic solder melting at a temperature of 250° C. may be considered. Further, as the conductive adhesive, a heat curing adhesive etc. may be considered.

In the present embodiment, the front and back surfaces of the interposer board 20 are provided with conductor patterns 23A, 23B, 24A, 24B. Further, solder resist is applied to necessary locations of the conductor patterns. Due to this, the pair of land patterns 21, 22 and the pair of external electrodes 31, 32 are provided on the front and back surfaces of the interposer board 20. Further, the interposer board 20 is provided with through hole electrodes 25, 26 connecting the conductor patterns 23A, 23B, 24A, 24B present on the front and back surfaces.

Conductor patterns 23A, 23B, 24A, 24B to necessary locations of which solder resist has been applied are provided on the front and back surfaces of the interposer board 20. The through hole electrodes 25, 26 connect the conductor patterns 23A, 23B, 24A, 24B of the front and back surfaces. Therefore, the pair of land patterns 21, 22 and the pair of external electrodes 31, 32 are reliably electrically connected.

A plurality of the through hole electrodes 25, 26 are provided in the interposer board 20 so as to pass through the interposer board 20. Therefore, the rigidity of the interposer board 20 is reduced by the presence of these through hole electrodes 25, 26 and vibration can be absorbed more by the interposer board 20.

Second Embodiment

Figure 8A:
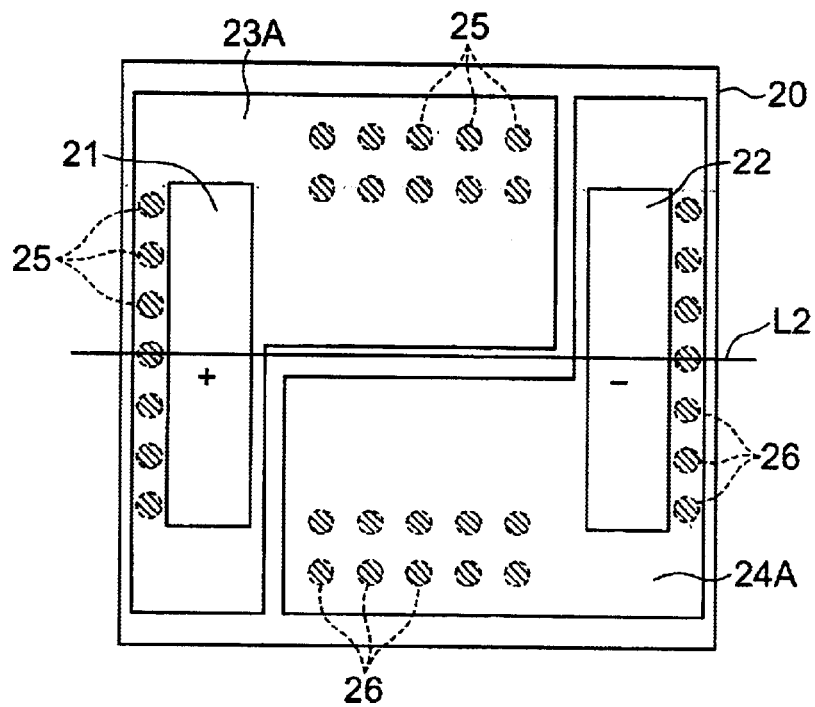
FIG. 8A is a plan view of an interposer board applied to a multilayer capacitor according to a second embodiment of the present invention.
Figure 8B:
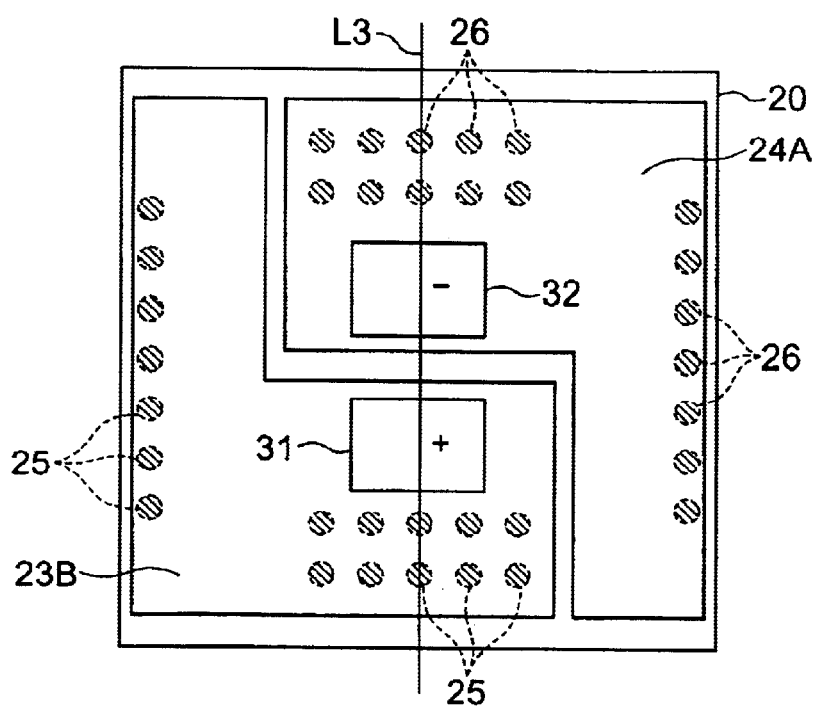
FIG. 8B is a bottom view of the back surface of FIG. 8A.

Next, an interposer board 20 for mounting a multilayer capacitor 1 of an electronic device according to a second embodiment of the present invention is shown in FIGS. 8A and 8B. Note that in explaining this embodiment, members the same as members explained in the first embodiment will be assigned the same reference numerals and overlapping explanations will be omitted.

The present embodiment is structured substantially the same as the first embodiment. However, as shown in FIG. 8A and FIG. 8B, in the present embodiment, the arrangement and shapes of the conductor patterns 23A, 23B, 24A, 24B, the land patterns 21, 22, the external electrodes 31, 32, and the through hole electrodes 25, 26 differ from those of the first embodiment. Further, the pair of capacitor patterns 21, 22 are formed longer in the L3 direction than in the first embodiment and the pair of external electrodes 31, 32 are formed shorter in the L2 direction than the first embodiment.

In this embodiment as well, not only can actions and effects similar to those of the first embodiment be achieved, but also since the pair of land patterns 21, 22 are long, connection is possible over the entire terminal electrodes 11, 12 of the capacitor body 2. Therefore, these may be more reliably connected.

Third Embodiment

Figure 10A:
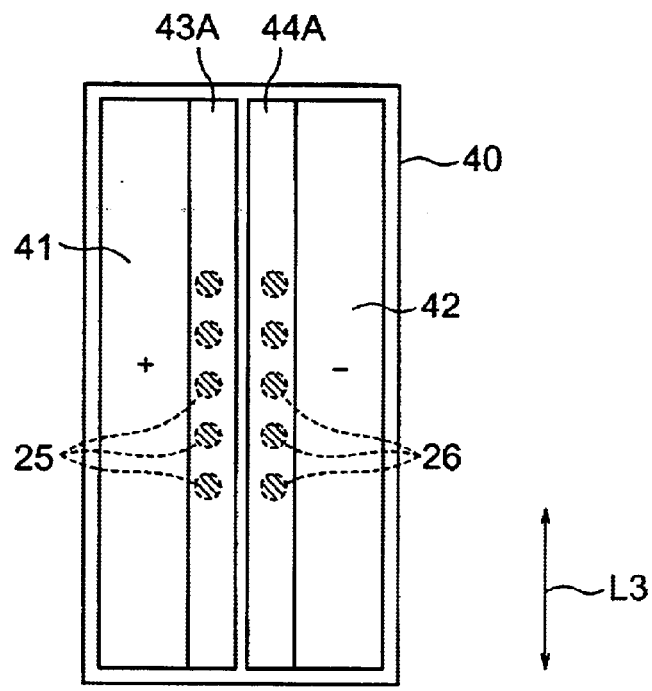
FIG. 10A is a plan view of an interposer board applied to a multilayer capacitor according to a third embodiment of the present invention.
Figure 10B:
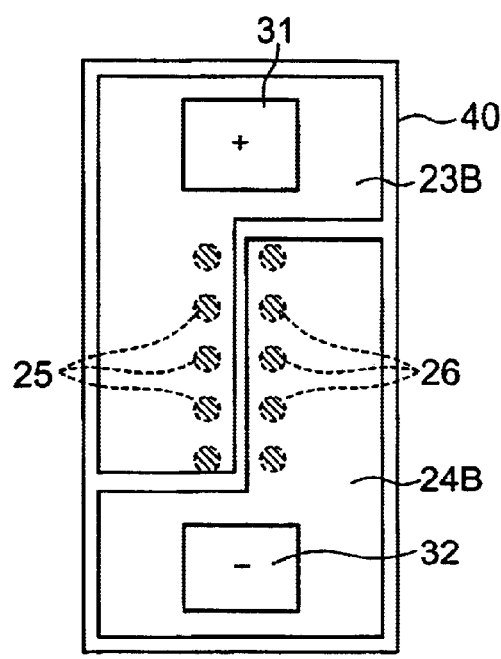
FIG. 10B is a bottom view of the back surface of FIG. 10A.

Next, a multilayer capacitor 1 of an electronic device according to a third embodiment of the present invention is shown in FIG. 10A and FIG. 10B. Note that in explaining this embodiment, members the same as members explained in the first embodiment will be assigned the same reference numerals and overlapping explanations will be omitted.

Figure 9:
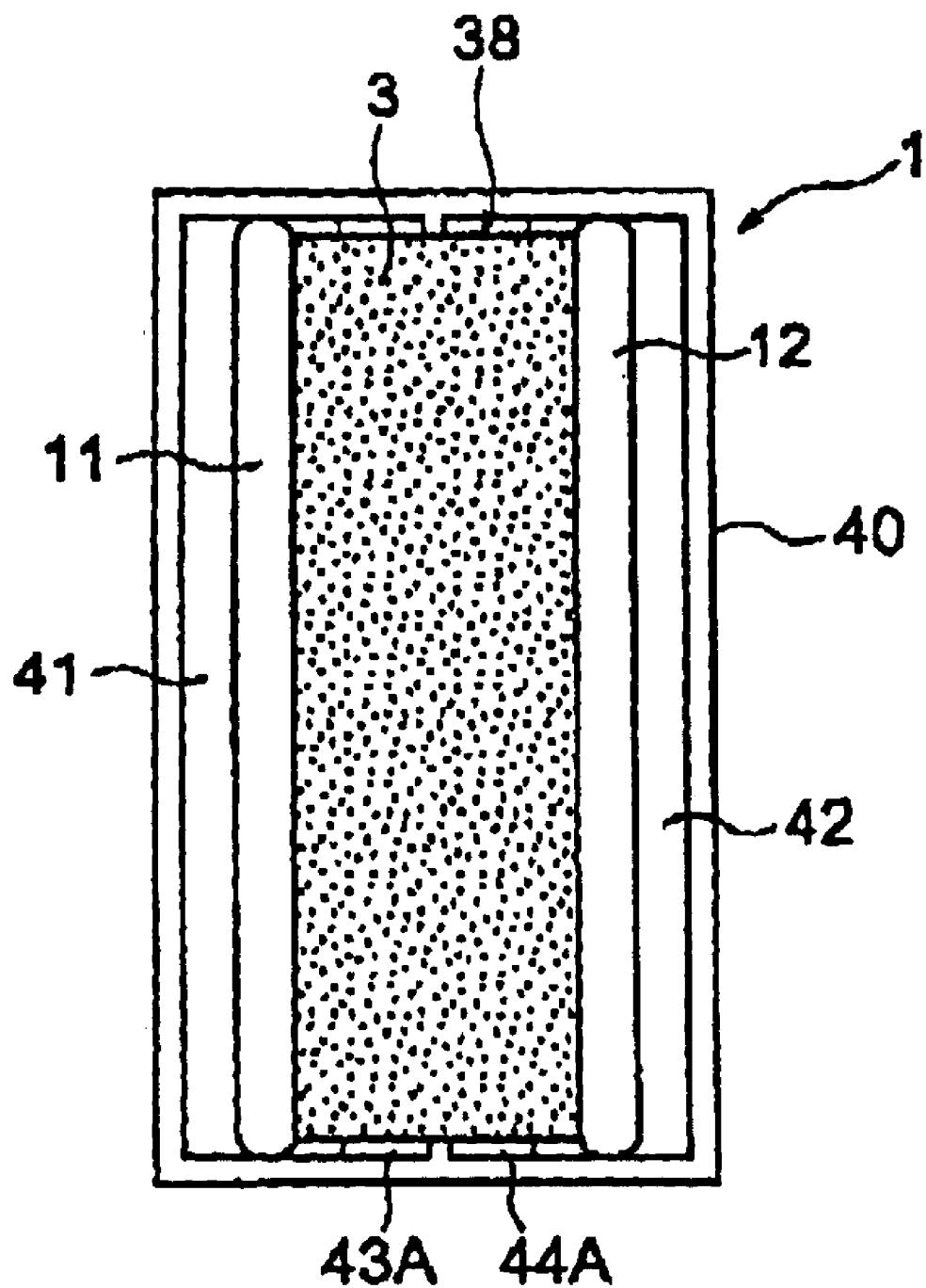
FIG. 9 is a plan view of a multilayer capacitor according to a third embodiment of the present invention (high temperature solder omitted)

The present embodiment is structured substantially the same as the first embodiment. However, as shown in FIG. 9 and FIGS. 10A and 10B, in the present embodiment, a capacitor body 38 lowered in ESL (equivalent serial inductance) and shortened in distance between the pair of terminal electrodes 11, 12 is employed.

Therefore, unlike the interposer board 20 of the first embodiment, the interposer board 40 of this embodiment is formed relatively narrow in the L3 direction. Further, the conductor patterns 43A, 44A formed on the front surface of the interposer board 40 are formed not as L-shapes, but as stripe shapes. A pair of land patterns 41, 42 are also provided across substantially all of the interposer board 40. The pair of terminal electrodes 11, 12 and the pair of land patterns 41, 42 are connected across the entire longitudinal direction.

In this embodiment as well, not only can actions and effects similar to those of the first embodiment be achieved, but also since the land patterns 41, 42 are formed narrow, connection is possible over the entire narrow terminal electrodes 11, 12. Therefore, in the same way as the second embodiment, these may be more reliably connected.

Third Embodiment

Figure 12A:
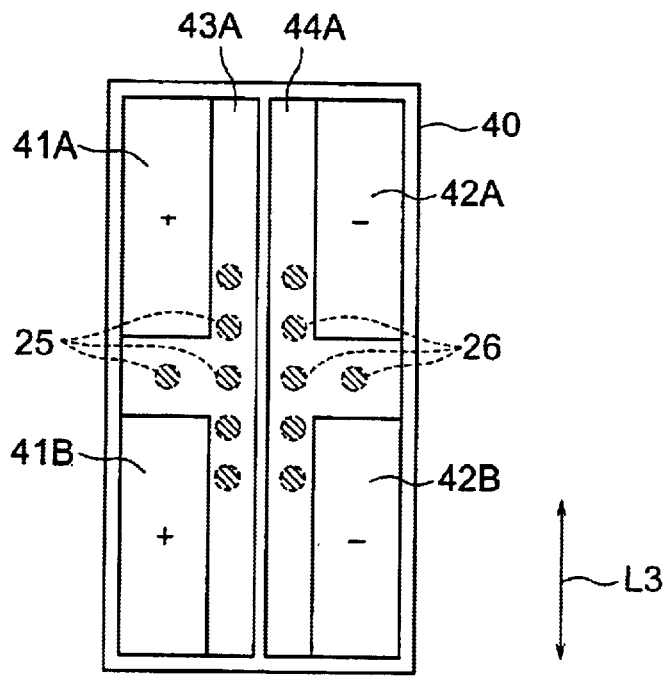
FIG. 12A is a plan view of an interposer board applied to a multilayer capacitor according to a fourth embodiment of the present invention.
Figure 12B:
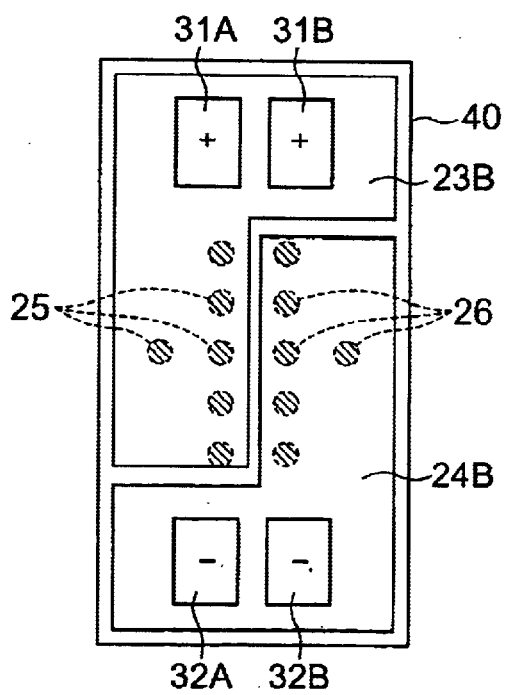
FIG. 12B is a bottom view of the back surface of FIG. 12A.

Next, a multilayer capacitor 1 of an electronic device according to a fourth embodiment of the present invention is shown in FIG. 12A and FIG. 12B. Note that in explaining this embodiment, members the same as members explained in the first embodiment will be assigned the same reference numerals and overlapping explanations will be omitted.

Figure 11:
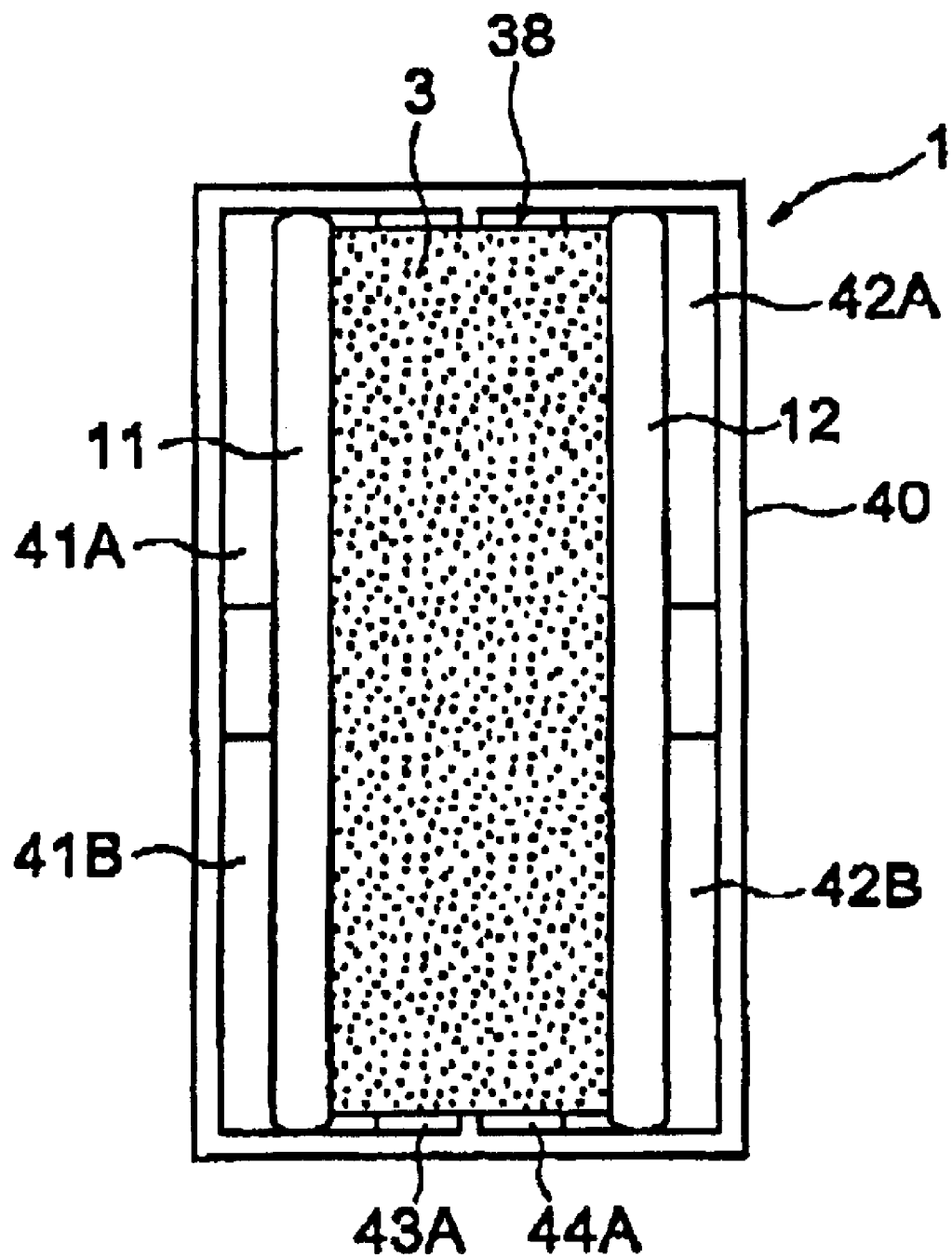
FIG. 11 is a plan view of a multilayer capacitor according to a fourth embodiment of the present invention (high temperature solder omitted)

The present embodiment is also structured substantially the same as the first embodiment, but as shown in FIG. 11, FIG. 12A and FIG. 12B, in this embodiment, like in the third embodiment, a capacitor body 38 of a short shape between the pair of terminal electrodes 11, 12 is employed. Therefore, in the same way as in the third embodiment, the interposer board 40 becomes a relatively narrow shape in the L3 direction and the conductor patterns 43A, 44A formed on the front surface of the interposer board 40 also are formed in stripe shapes.

In the present embodiment, however, the land patterns are made pairs of land patterns 41A, 41B and land patterns 42A, 42B separated in the L3 direction. The terminal electrode 11 and these land patterns 41A, 41B are connected at parts close to the two ends in the longitudinal direction. Further, the terminal electrode 12 and the land patterns 42A, 42B are connected at parts close to the two ends in the longitudinal direction. Further, corresponding to this, the external electrodes formed on the back surface of the interposer board 40 become the pairs of external electrodes 31A, 31B and external electrodes 32A, 32B.

In this embodiment as well, not only can actions and effects similar to those of the first embodiment be achieved, but also since the land patterns 41, 42 are formed separated from each other in the vertical direction, reliable connection at the two ends of the narrow terminal electrodes 11, 12 becomes possible. Therefore, in the same way as the second and third embodiments, these may be more reliably connected.

Fifth Embodiment

Figure 13A:
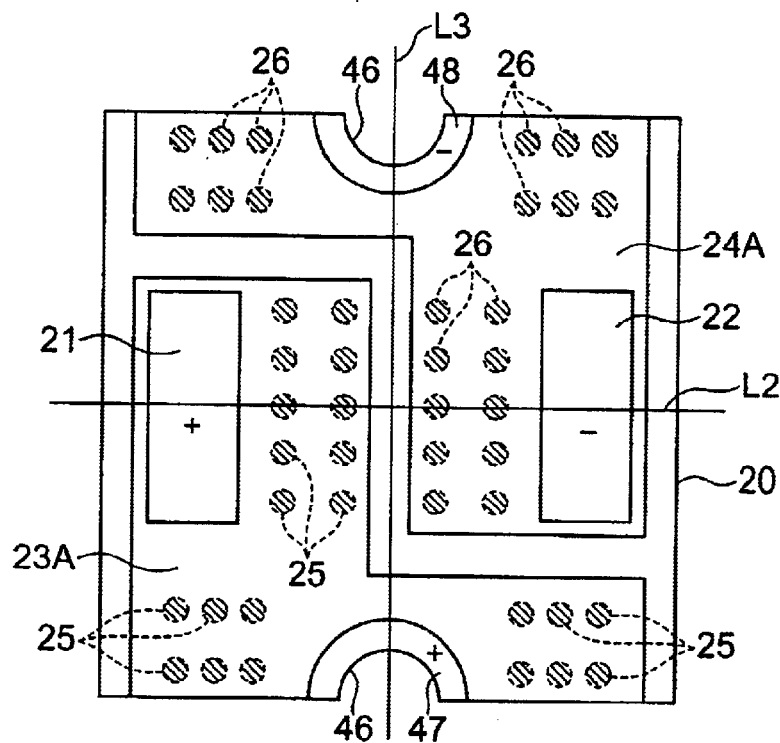
FIG. 13A is a plan view of an interposer board applied to a multilayer capacitor according to a fifth embodiment of the present invention.
Figure 13B:
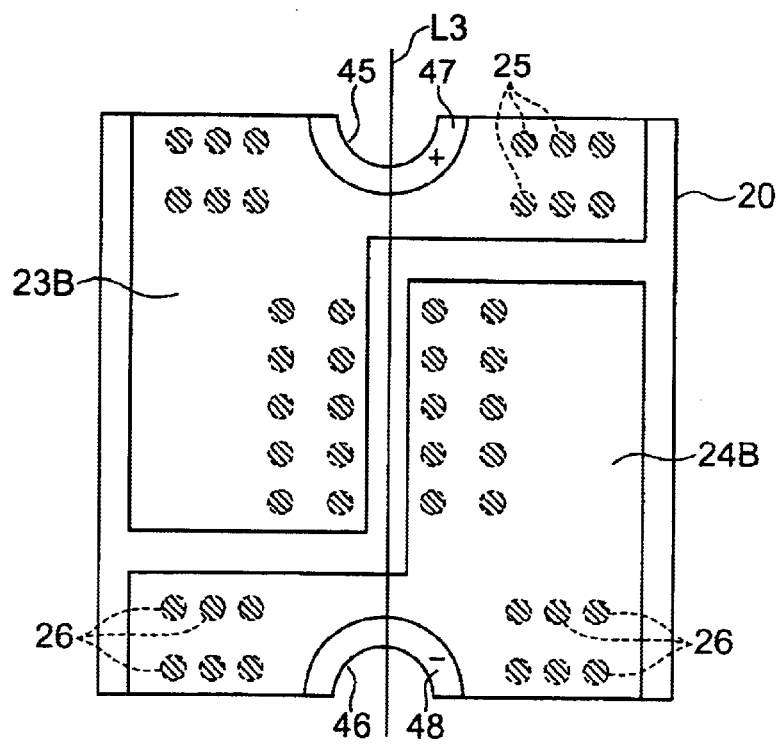
FIG. 13B is a bottom view of the back surface of FIG. 13A.

Next, a multilayer capacitor 1 of an electronic device according to a fifth embodiment of the present invention is shown in FIG. 13A and FIG. 13B. Note that in explaining this embodiment, members the same as members explained in the first embodiment will be assigned the same reference numerals and overlapping explanations will be omitted.

The present embodiment is also structured substantially the same as the first embodiment, but as shown in FIG. 13, in the present embodiment, parts at the two ends of the interposer board 20 in the L3 direction are provided with recesses 45, 46 of semicircular shapes cut into those parts.

Further, the recess 45 is provided around it with an external electrode 47 serving also as a connecting electrode connecting the conductor patterns 23A, 23B provided at the front and back surfaces of the interposer board 20. Further, the recess 46 is provided around it with an external electrode 48 serving similarly as a connecting electrode connecting the conductor patterns 24A, 24B provided at the front and back surfaces of the interposer board 20.

This embodiment also can achieve actions and effects similar to the first embodiment. Further, in this embodiment, since the through hole electrodes 25, 26 and the external electrodes 47, 48 themselves connect the conductor patterns 23A, 23B, 24A, and 24B of the front and back surfaces of the interposer board 20, the pair of land patterns 21, 22 and the pair of external electrodes 47, 48 are electrically connected more reliably. Further, if employing the external electrodes 47, 48 of the present invention, the external electrodes 47, 48 are electrically connected to the land patterns 21, 22 even without the through hole electrodes 25, 26.

Sixth Embodiment

Figure 14A:
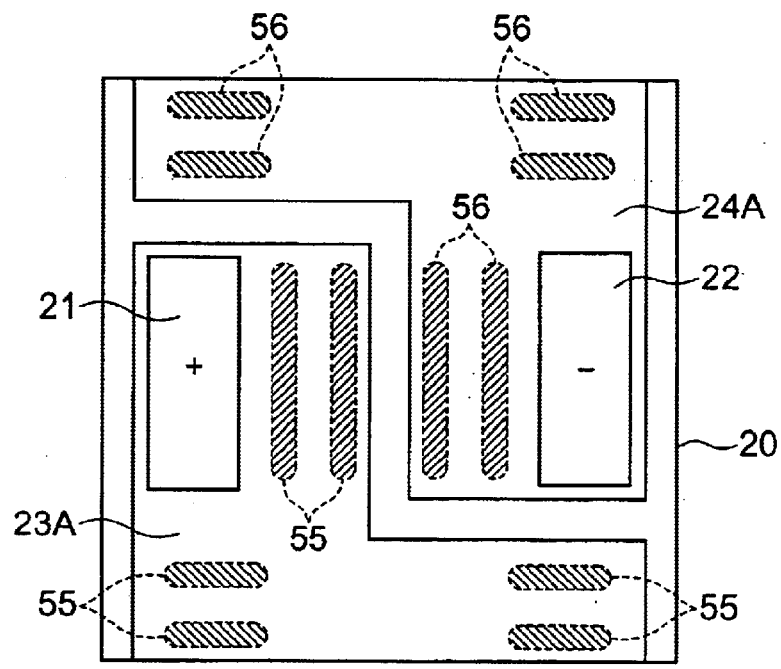
FIG. 14A is a plan view of an interposer board applied to a multilayer capacitor according to a sixth embodiment of the present invention.
Figure 14B:
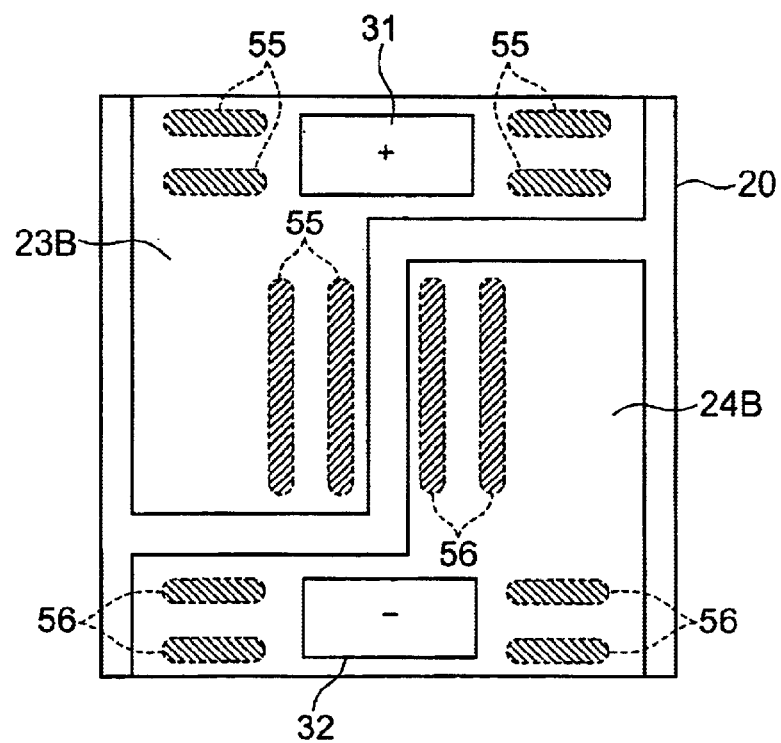
FIG. 14B is a bottom view of the back surface of FIG. 14A.

Next, a multilayer capacitor 1 of an electronic device according to a sixth embodiment of the present invention is shown in FIG. 14A and FIG. 14B. Note that in explaining this embodiment, members the same as members explained in the first embodiment will be assigned the same reference numerals and overlapping explanations will be omitted.

The present embodiment is also structured substantially the same as the first embodiment, but instead of the through hole electrodes 25, 26, in the present embodiment, the slit-shaped connecting electrodes 55, 56 shown in FIG. 14A and FIG. 14B are employed.

By providing a plurality of these connecting electrodes 55, 56 at the interposer board 20, the rigidity of the interposer board 20 drops by a large extent due to the presence of the connecting electrodes 55, 56 and therefore the vibration can be absorbed by the interposer board 20 more reliably.

Seventh Embodiment

Figure 15:
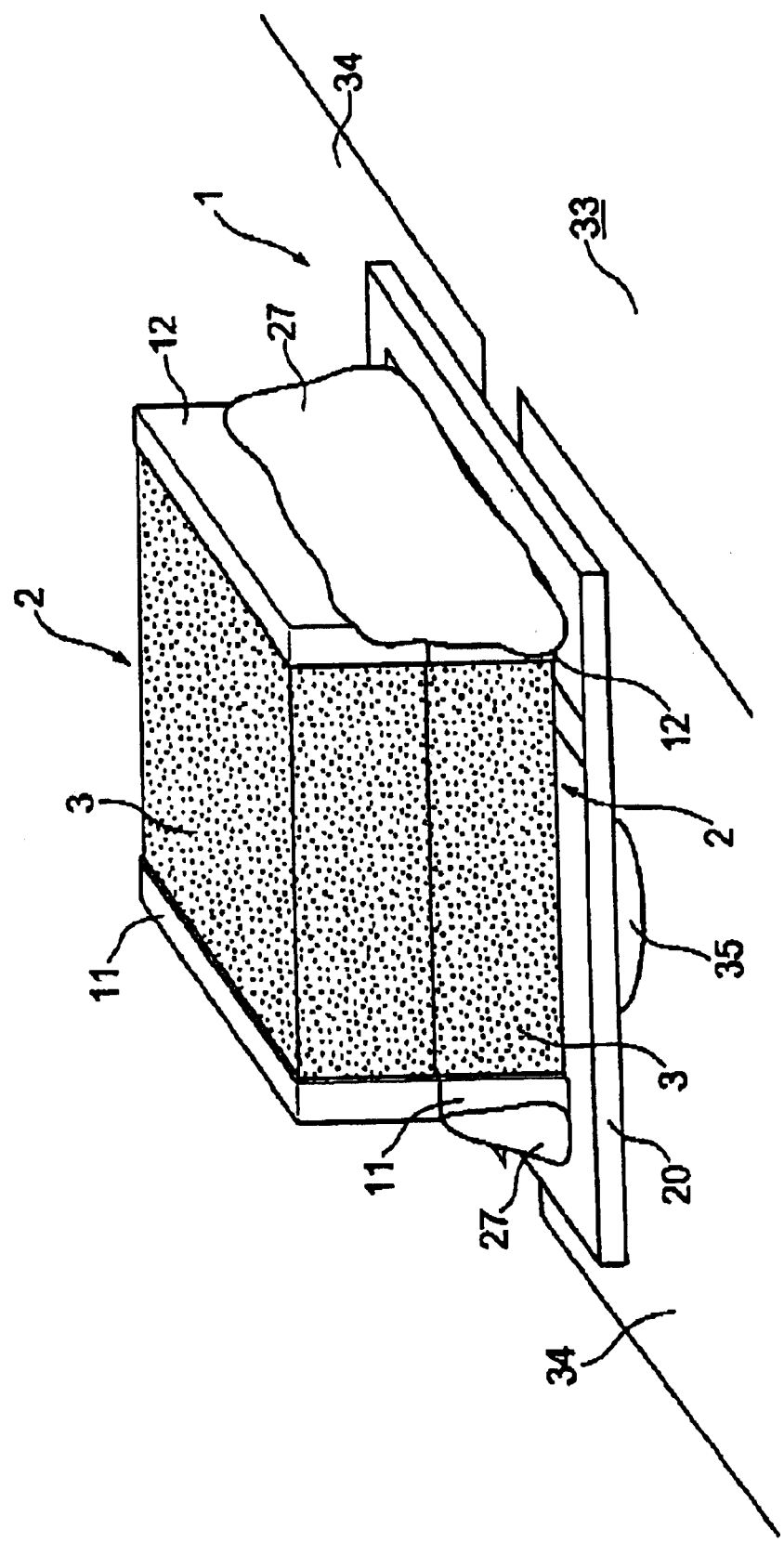
FIG. 15 is a perspective view of the state of mounting on a board of a multilayer capacitor according to a seventh embodiment of the present invention.

Next, a multilayer capacitor 1 of an electronic device according to a seventh embodiment of the present invention is shown in FIG. 15. Note that in explaining this embodiment, members the same as members explained in the first embodiment will be assigned the same reference numerals and overlapping explanations will be omitted.

The present embodiment is also structured substantially the same as the first embodiment. However, as shown in FIG. 15, in the present embodiment, there are a plurality of capacitor bodies 2. These plurality of capacitor bodies 2 are arranged stacked on the interposer board 20.

That is, by arranging a plurality of capacitor bodies 2, a multilayer capacitor 1 having a higher electrostatic capacity can be easily obtained and replacement of aluminum electrolytic capacitors becomes easier. Note that by soldering together the terminal electrodes 11 and 12 of the plurality of capacitor bodies 2, the plurality of capacitor bodies 2 are connected conductively.

EXAMPLE

Next, the amounts of vibration of test boards mounted with the following samples were measured using a laser Doppler vibrometer to obtain the vibration characteristics of the samples causing noise.

Figure 16:
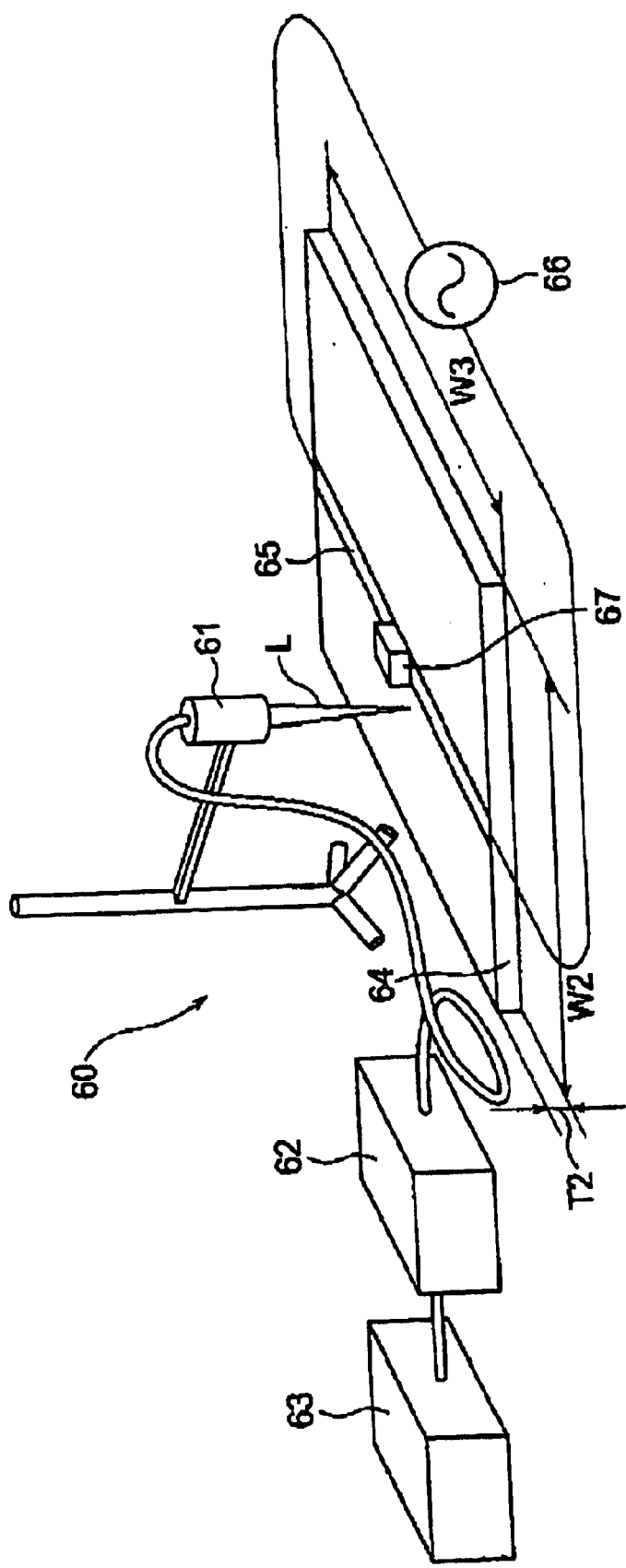
FIG. 16 is an explanatory view of the state of measurement of samples.

Specifically, as shown in FIG. 16, the laser Doppler vibrometer 60 is comprised of a sensor 61 emitting an infrared laser beam L and able to detect the reflected infrared laser beam L, an O/E unit 62 for converting the infrared laser beam L to an electrical signal, an oscilloscope 63 displaying the electrical signal converted at the O/E unit 62, etc. Further, a test board 64 placed about 1 mm away from the sample was irradiated by the infrared laser beam L from the sensor 61 of the laser Doppler vibrometer 60 and the vibration transmitted from the multilayer bodies of the samples to the test board 64 was detected by the sensor 61.

Next, details of the samples will be explained. That is, the multilayer ceramic capacitor 110 shown in FIG. 18 in general use as a capacitor was used as a conventional example, while the multilayer capacitor 1 according to the first embodiment comprised of a capacitor body 2 shown in FIG. 1 of a similar structure to the multilayer ceramic capacitor 110 mounted on the interposer board 20 was used as an example of the invention.

Figure 18:
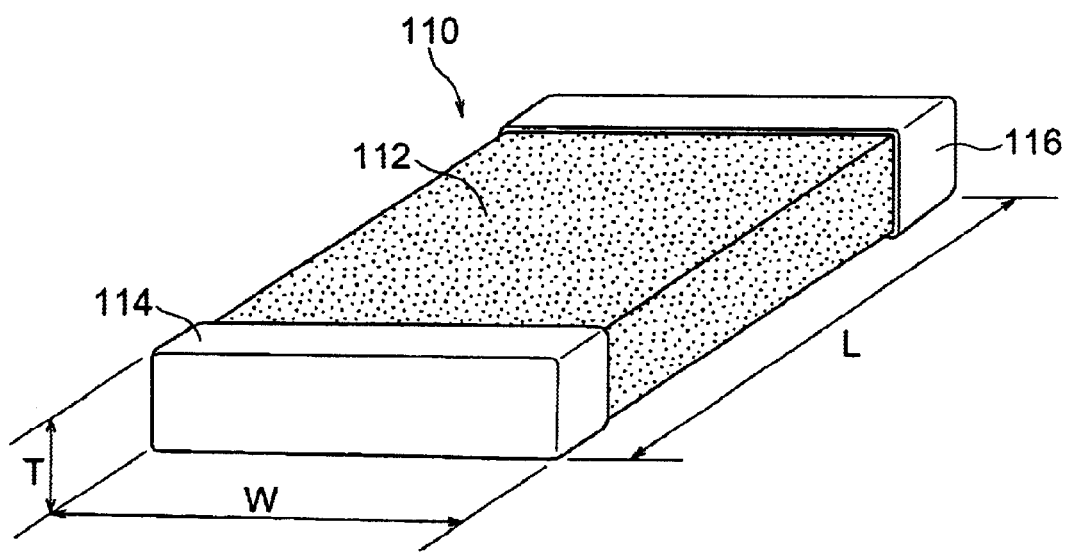
FIG. 18 is a perspective view of a general multilayer ceramic capacitor.
Figure 19:
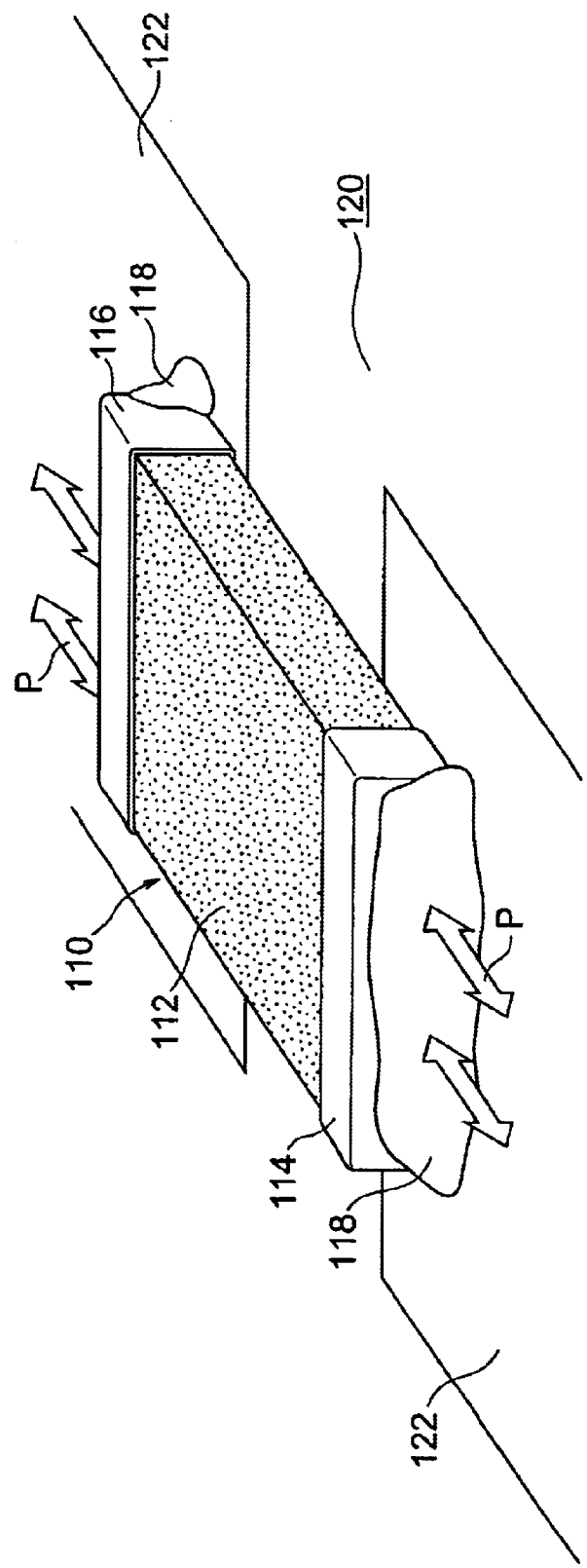
FIG. 19 is a perspective view of a conventional state where a multilayer ceramic capacitor is mounted on a board.
Figure 20:
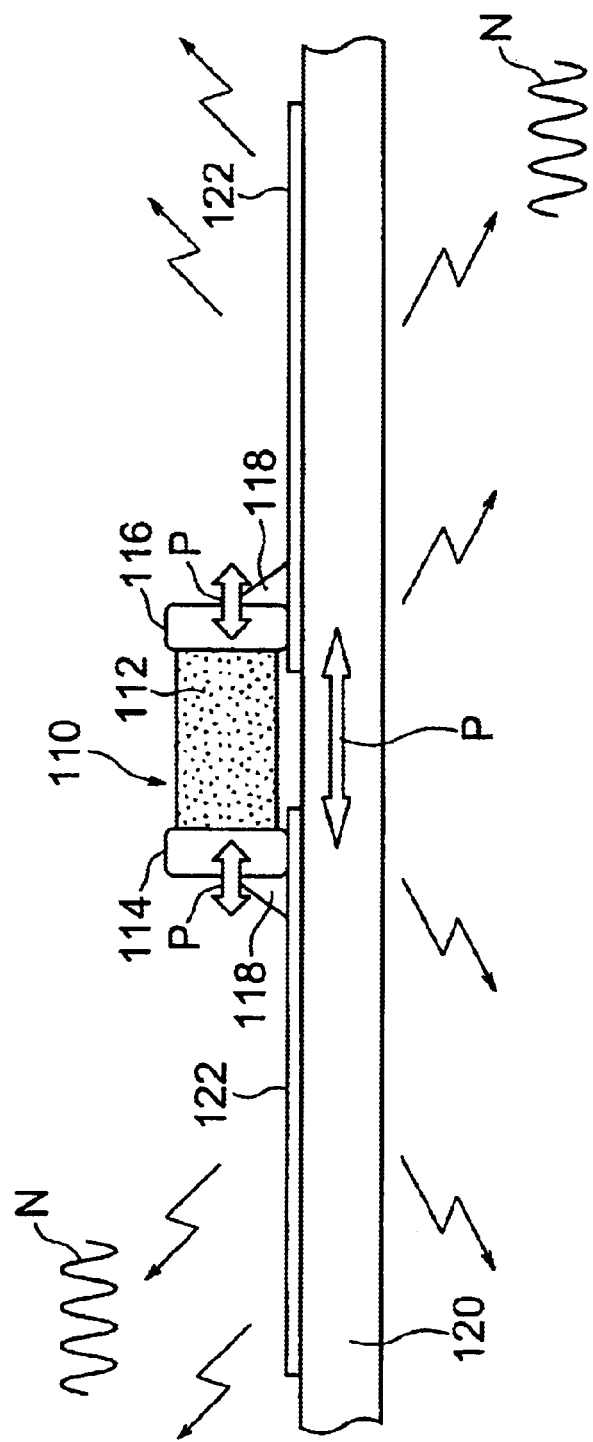
FIG. 20 is a front view of a conventional state where a multilayer ceramic capacitor is mounted on a board, showing the state of occurring noise.

As the dimensions of the samples used here, as shown in FIG. 18 and FIG. 1, when the distance between the side faces where the pair of terminal electrodes are provided is designated the dimension L, the distance between the side faces perpendicular with these side faces the dimension W, and the thickness the dimension T, in both the conventional example and the example of the invention, L=3.2 m, W=2.5 mm, and T=2.5 mm.

Further, the external dimensions of the interposer board 20 of the embodiment shown in FIG. 1 were L1=4.5 mm, W1–3.2 mm, and T1=1.0 mm. The interposer board 20 was mainly made of a glass epoxy-based resin. Further, the copper foil forming the conductor patterns 23A, 23B, 24A, and 24B provided on the interposer board 20 had a thickness of 35 μm.

On the other hand, the external dimensions of the test board 64 used in the test shown in FIG. 16 were W3=10.0 mm, W2=40 mm, and T2=1.6 mm. The test board 64 was mainly made of a glass epoxy-based resin. The copper foil forming the interconnect patterns 65 had a thickness of 35 μm. Further, the voltage applied to the samples from the power source 66 connecting to the samples 67 on the test board 64 shown in FIG. 16 was, in addition to a 20V DC voltage, a 1.0 Vrms AC voltage made a sine wave of 5 kHz.

Figure 17A:
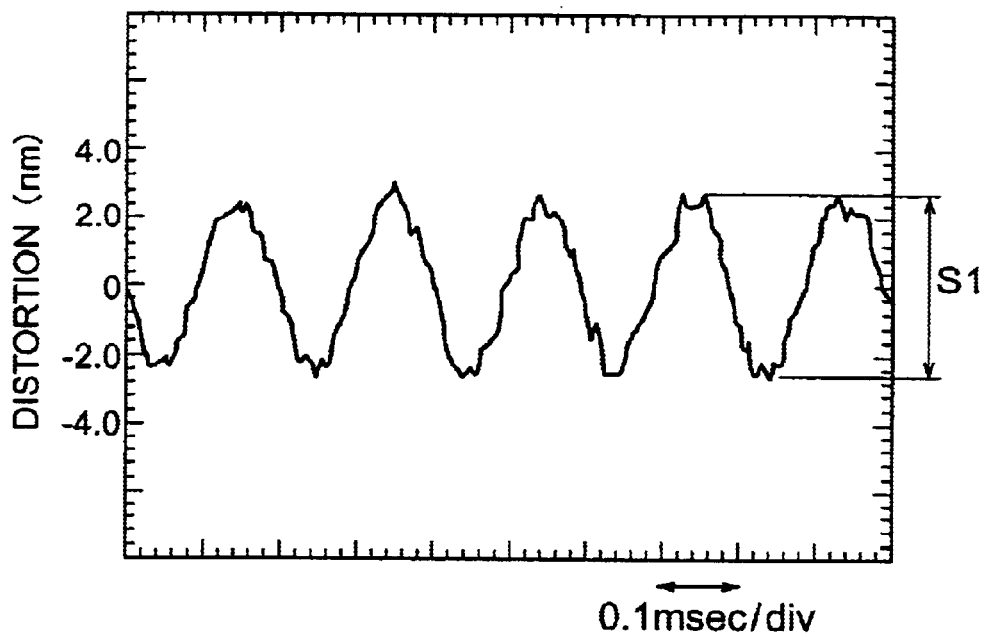
FIG. 17A is a view showing a waveform of an oscilloscope which shows the vibration waveform of a test board of a conventional example.
Figure 17B:
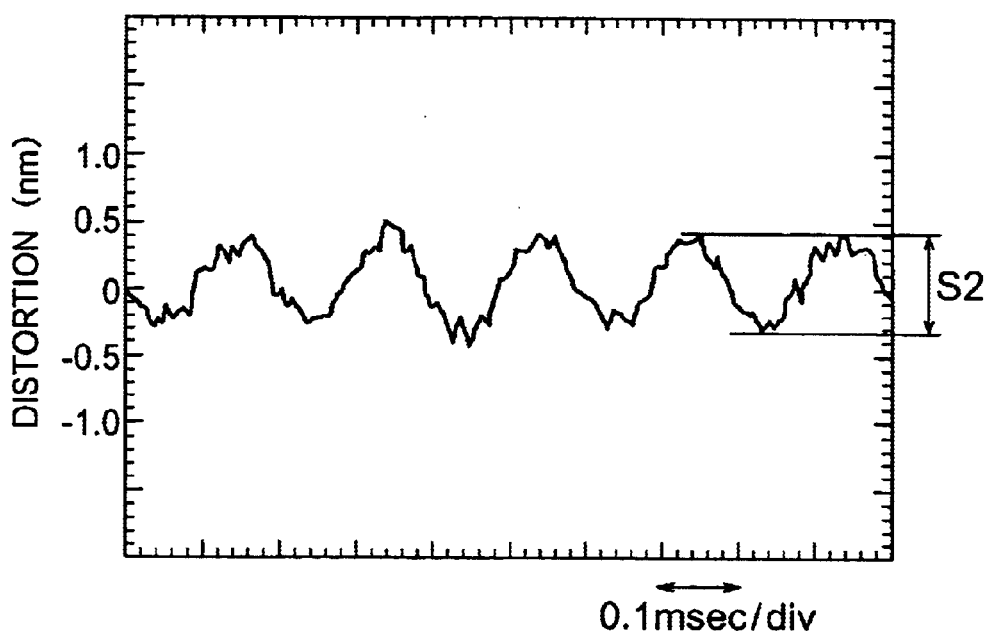
FIG. 17B is a view showing a waveform of an oscilloscope which shows the vibration waveform of a test board of an example of the invention.

Looking at the results of the above test, from the waveform of an oscilloscope, the amount of strain S1 of the maximum amplitude of vibration of the test board 64 shown in FIG. 17A was about 4.8 nm in the conventional example of only a multilayer capacitor, while the amount of strain S2 of the maximum amplitude of vibration of the test board 64 shown in FIG. 17B was a small one of about 0.8 m in the example of the invention having the interposer board 20.

That is, the fact that, compared with the conventional example, the example of the invention was greatly reduced in the amount of vibration of the board and reduced in noise was confirmed from the results of measurement. Here, the nominal electrostatic capacities of the conventional example and the example of the invention in the case of capacitors were 10 μF, but in actuality the electrostatic capacity of the conventional example was 10.24 μF and the electrostatic capacity of the example of the invention was 10.13 μF.

Note that the interposer board 20 forming part of the multilayer capacitor 1 according to the above embodiments was a single layer board, but it is also possible to use a multilayer board for the interposer board. Further, the material of the interposer board 20 was made a glass epoxy-based resin, but it is also possible to use a fluororesin, paper phenol, polyamide-based resin, alumina (ceramic), or other material.

Further, in the above embodiments, the front and back surfaces of the interposer board 20 were electrically connected by through hole electrodes or external electrodes themselves, but it is also possible to extend for example copper foil conductor patterns to the end faces of the interposer board 20. By doing this, it is also possible to electrically connect the front and back surfaces of the interposer board through the end faces.

On the other hand, in the above embodiments, the line L2 and line L3 and the line L1 and line L3 intersected perpendicularly, but the angle between the lines need not be right angles. It is sufficient that the angle be in a range required for reducing the generation of noise. Such a range of angle is preferably from 60 to 90, more preferably from 70 to 90.

Further, in the seventh embodiment, two capacitor bodies 2 were stacked on the interposer board 20, but it is also possible to stack three or more capacitor bodies 2 on the interposer board 20.

According to the present invention, it is possible to provide an electronic device suppressing propagation of vibration occurring due to a piezoelectric property and electrostriction and reduce the spread of noise.

While the invention has been described with reference to specific embodiments chosen for purpose of illustration, it should be apparent that numerous modifications could be made thereto by those skilled in the art without departing from the basic concept and scope of the invention.

What is claimed is:

1. An electronic device having:
   a body having a pair of terminal electrodes and
   an interposer board to a front surface of which the pair of terminal electrodes are connected and having on its back surface a pair of external electrodes electrically connected to the parts where the pair of terminal electrodes are connected, wherein
   the terminal electrodes and the external electrodes are arranged in a positional relationship where the direction of a line connecting the pair of terminal electrodes and the direction of a line connecting the pair of external electrodes intersect.

2. The electronic device as set forth in claim 1, wherein:
   a pair of land patterns to which the pair of terminal electrodes are to be connected are provided on the front surface of the interposer board, and
   these land patterns and external electrodes are arranged in a positional relationship where the direction of a line connecting the pair of land patterns and the direction of the line connecting the pair of external electrodes intersect.

3. The electronic device as set forth in claim 1, wherein said pair of terminal electrodes in said body and said interposer board are connected by one of high temperature solder and a conductive adhesive.

4. The electronic device as set forth in claim 2, wherein front and back surfaces of said interposer board are provided with conductor patterns, solder resist is coated on the surfaces of the conductor patterns to expose at least part of the surfaces of the conductor patterns, and as a result the pair of land patterns are formed on the front surface of the interposer board and the pair of external electrodes are formed on the back surface of the interposer board.

5. The electronic device as set forth in claim 4, wherein connecting electrodes connecting the conductor patterns present on the front and back surfaces of the interposer board are provided on the interposer board.

6. The electronic device as set forth in claim 5, wherein said connecting electrodes are through hole electrodes passing through said interposer board.

7. The electronic device as set forth in claim 4, wherein the ends of the interposer board are recessed and the connecting electrodes are arranged in the recessed parts.

8. The electronic device as set forth in claim 1, wherein the electronic device has a plurality of said bodies and the plurality of said bodies are arranged on said interposer board.

9. The electronic device as set forth in claim 1, wherein said body is a multilayer capacitor.

10. An interposer board to a front surface of which a pair of terminal electrodes are to be connected and having on its back surface a pair of external electrodes electrically connected to parts where the pair of terminal electrodes are connected, wherein:

a pair of land patterns to which the pair of terminal electrodes are to be connected are provided on a front surface of said interposer board, and these land patterns and external electrodes are arranged in a positional relationship where the direction of a line connecting the pair of land patterns and the direction of the line connecting the pair of external electrodes intersect.

11. The interposer board as set forth in claim 10, wherein front and back surfaces of said interposer board are provided with conductor patterns, solder resist is coated on the surfaces of the conductor patterns to expose at least part of the surfaces of the conductor patterns, and as a result the pair of land patterns are formed on the front surface of the interposer board and the pair of external electrodes are formed on the back surface of the interposer board.

12. The interposer board as set forth in claim 11, wherein connecting electrodes connecting the conductor patterns present on the front and back surfaces of the interposer board are provided on the interposer board.

13. The interposer board as set forth in claim 12, wherein said connecting electrodes are through hole electrodes passing through said interposer board.

14. The interposer board as set forth in claim 11, wherein the ends of the interposer board are recessed and the connecting electrodes are arranged in the recessed parts.

* * * * *